(12) United States Patent
Jang

(10) Patent No.: US 10,403,780 B2
(45) Date of Patent: Sep. 3, 2019

(54) PHOTOCONDUCTIVE SEMICONDUCTOR SWITCH AND METHOD FOR MANUFACTURING THE SAME

(71) Applicant: GWANGJU INSTITUTE OF SCIENCE AND TECHNOLOGY, Gwangju (KR)

(72) Inventor: Jae Hyung Jang, Gwangju (KR)

(73) Assignee: GWANGJU INSTITUTE OF SCIENCE AND TECHNOLOGY, Gwangju (KR)

(*) Notice: Subject to any disclaimer, the term of this patent is extended or adjusted under 35 U.S.C. 154(b) by 133 days.

(21) Appl. No.: 15/532,980

(22) PCT Filed: Apr. 29, 2015

(86) PCT No.: PCT/KR2015/004289
§ 371 (c)(1),
(2) Date: Sep. 7, 2017

(87) PCT Pub. No.: WO2016/088952
PCT Pub. Date: Jun. 9, 2016

(65) Prior Publication Data
US 2018/0053872 A1 Feb. 22, 2018

(30) Foreign Application Priority Data
Dec. 2, 2014 (KR) .................. 10-2014-0170566

(51) Int. Cl.
*H01L 31/107* (2006.01)
*H01L 27/14* (2006.01)
(Continued)

(52) U.S. Cl.
CPC .......... *H01L 31/1075* (2013.01); *H01L 27/14* (2013.01); *H01L 31/03046* (2013.01);
(Continued)

(58) Field of Classification Search
CPC ......... H01L 31/1075; H01L 31/035281; H01L 31/109; H01L 31/1844; H01L 31/03046; H01L 31/1868; H01L 27/14; H03K 17/78
See application file for complete search history.

(56) References Cited

U.S. PATENT DOCUMENTS

| 6,248,992 B1 * | 6/2001 | Baca ................. H01L 31/09 250/214 LS |
| 2012/0098607 A1 * | 4/2012 | Tatoian ............... F41H 13/0068 331/96 |
| 2014/0240510 A1 * | 8/2014 | Takenaka ............ H04N 5/33 348/162 |

FOREIGN PATENT DOCUMENTS

| JP | 2003-86824 A | 3/2003 |
| JP | 2003-209269 A | 7/2003 |

(Continued)

OTHER PUBLICATIONS

Mar, A. et al. Doped contacts for high-longevity optically activated, high-gain GaAs photoconductive semiconductor switches. IEEE T. Plasma Sci. 28 (2000) 1507-1511 (Year: 2000).*
(Continued)

*Primary Examiner* — Lex H Malsawma
*Assistant Examiner* — Gardner W. S. Swan
(74) *Attorney, Agent, or Firm* — Womble Bond Dickinson (US) LLP; Joseph Bach, Esq.

(57) ABSTRACT

There is provided a photoconductive semiconductor switch device comprising: a semiconductor substrate configured to generate electrons and holes using incident light thereto; at least one pair of conductive layers disposed on the semiconductor substrate, wherein one pair of the conductive layers consists of first and second conductive layers spaced apart from each other, wherein each of the first and second conductive layers contains abundant electrical carriers to have a low resistance; and first and second electrodes disposed on at least partially on the first and second conductive layers respectively. In this way, the application of the photoconductive semiconductor switch device may be widened.

18 Claims, 3 Drawing Sheets

(51) Int. Cl.
*H01L 31/0304* (2006.01)
*H01L 31/18* (2006.01)
*H01L 31/0352* (2006.01)
*H01L 31/109* (2006.01)
*H03K 17/78* (2006.01)

(52) U.S. Cl.
CPC .... *H01L 31/035281* (2013.01); *H01L 31/109* (2013.01); *H01L 31/1844* (2013.01); *H01L 31/1868* (2013.01); *H03K 17/78* (2013.01); *Y02E 10/544* (2013.01)

(56) References Cited

FOREIGN PATENT DOCUMENTS

| | | |
|---|---|---|
| JP | 2008-98576 A | 4/2008 |
| JP | 2013-62658 A | 4/2013 |
| JP | 2014-165413 A | 9/2014 |
| KR | 10-2013-0030548 A | 3/2013 |
| KR | 10-1291319 B1 | 7/2013 |
| KR | 10-1644794 B1 | 8/2016 |

OTHER PUBLICATIONS

Office Action in Korean Patent Application No. 10-2014-0170566 dated May 9, 2016.
International Search Report for PCT/KR2015/004289 dated Aug. 25, 2015.

\* cited by examiner

--Prior Art--

PHOTOCONDUCTIVE SEMICONDUCTOR SWITCH AND METHOD FOR MANUFACTURING THE SAME

TECHNICAL FIELD

The present invention relates to a photoconductive semiconductor switch device. More particularly, the present invention relates to a photoconductive semiconductor switch device capable of reliably operating in extreme environments defined by high voltages and high outputs, and a method for manufacturing the switch device.

BACKGROUND ART

The photoconductive semiconductor switch device PCSS converts an optical signal into an electrical signal. In particular, the PCSS may convert a pulse-shaped optical signal in very high frequency or terahertz frequency bands into an electrical signal to generate an electromagnetic wave.

The photoconductive semiconductor switch device operates as follows. First, photons incident from the outside thereto are absorbed by a semiconductor layer therein to generate electron/hole pairs therein. The electron/hole pairs are separated and then accelerated by an electric field generated in the semiconductor layer by a voltage applied thereto from the outside, thereby to have a high kinetic energy. Thus, avalanche multiplication of the carriers may occur due to the high kinetic energy. The separated electrons and holes are collected by two electrodes of the switch device respectively. In this way, the external light is converted into an electrical signal while generating the electromagnetic wave. In order for the photoconductive semiconductor switch device to form a very short electrical pulse via fast electrical response, the mobility of the electrons and holes in the semiconductor layer must be higher, and the carrier lifetime must be short. The mobility of the carrier defines a rising time of the pulse and the lifetime of the carrier defines a falling time of the pulse.

On the other hand, in order to the photoconductive semiconductor switch device to switch the high power, the photoconductive semiconductor switch device must prevent the current from flowing by generating a high resistance in the absence of the incident light thereto, whereas, in the case of the presence of the incident light thereto, the switch device should sufficiently reduce the resistance in an entire path of the current resulting from the flow of the electrons and holes in the semiconductor layer. Briefly, the difference between the resistance in the presence of the incident light and the resistance in the absence of the incident light is one of the most important performance indicators of the photoconductive semiconductor switch device operating at the high voltage and high power. Specifically, in order that the current in the switch device does not flow even when a voltage of hundreds to thousands KV is applied to the photoconductive semiconductor switch device, thereby to maintain a circuit enabled by the switch device in an open state, the resistance of the photoconductive semiconductor switch device in the absence of the incident light thereto should be Giga Ω or higher to suppress the current to a very low level. As a result, it is desirable that the semiconductor layer of the photoconductive semiconductor switch device acts as an insulator in the absence of the incident light.

Further, a maximum allowable voltage for the photoconductive semiconductor switch device may be influenced by a maximum allowable electric field strength in the semiconductor layer, and a distance between the two electrodes provided in the photoconductive semiconductor switch device. However, the maximum allowable voltage for the photoconductive semiconductor switch device may be actually more influenced by deteriorations thereof due to a current filament generated around each of the electrodes, the semiconductor layer breakdown, and deteriorations thereof due to a flashover on the semiconductor layer surface when the high current flows in the photoconductive semiconductor switch device. Due to these constraints, the operating voltage of the photoconductive semiconductor switch device may be limited to be a voltage much lower than a theoretical dielectric breakdown voltage. In other words, the maximum allowable voltage for the photoconductive semiconductor switch device is limited by the deteriorations thereof due to the breakdown and/or flashover around the electrode and/or on the semiconductor surface.

In order to manufacture the photoconductive semiconductor switch device capable of withstanding the high voltage and high output, a structure or a process for the PCSS capable of suppressing the flashover on the electrode surface and the current filament around the electrode is necessarily required.

FIG. 5 is a cross-sectional view of a photoconductive semiconductor switch device according to a prior art, wherein one electrode region is enlarged. Referring to FIG. 5, since the electrode prevents the incident light from being incident on the semiconductor, the resistances of the semiconductor regions nearby the edge of the electrode and beneath the electrode are very large. Therefore, the switch device deterioration phenomenon mainly starts from the semiconductor regions nearby the edge of the electrode and beneath the electrode.

Specifically, when operating the photoconductive semiconductor switch device at a high voltage, a very high electric field generated in the semiconductor layer energizes a small amount of electrons and holes generated by the absorbed photons thereto. Further, the accelerated electrons and holes are exponentially increased in number via the avalanche multiplication as described above. The photoconductive semiconductor switch device operating in the voltage range with such an optical gain may be called a non-linear photoconductive semiconductor switch device.

At this time, a very high current flows via the current filament generated in the semiconductor layer. When the high current flows in the semiconductor layer, the significant electrical energy is consumed in the semiconductor region with a higher resistance, and, thus, the temperature rises due to an ohmic loss in the semiconductor region with the higher resistance. As a result, a defect may be generated in the semiconductor region, and a metal or a semiconductor may be burned around the electrode. This becomes a major factor limiting the operating voltage of the photoconductive semiconductor switch device.

DISCLOSURE OF THE INVENTION

Technical Problem

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter. The present disclosure is to provide a photoconductive semiconductor switch device capable of reliably operating in extreme environments defined by high voltages and high outputs, and a method for manufacturing the switch device.

Technical Solution

In one aspect, there is provided a photoconductive semiconductor switch device comprising: a semiconductor substrate configured to generate electrons and holes using incident light thereto; at least one pair of conductive layers disposed on the semiconductor substrate, wherein one pair of the conductive layers consists of first and second conductive layers spaced apart from each other, wherein each of the first and second conductive layers contains abundant electrical carriers to have a low resistance; and first and second electrodes disposed on at least partially on the first and second conductive layers respectively. In this way, the application of the photoconductive semiconductor switch device may be widened.

In one embodiment, the first and/or second conductive layers include first and/or second ledge portions respectively, wherein each of the first and/or second ledge portions further extends inwardly from each of positions of the first and/or second conductive layers vertically overlapping each of inner ends of the first and/or second electrodes, wherein the first and/or second ledge portions respectively act to lower electrical resistances in regions of the semiconductor substrate vertically overlapping the first and/or second ledge portions. In one embodiment, the first and second conductive layers include the first and second ledge portions respectively. In one embodiment, a spacing between the first and second electrodes is about 10 to 500 times larger than a length of each of the first and/or second ledge portions. In one embodiment, the spacing is in a range of about 0.1 mm to 5 mm, and the length is in a range of about 10 μm to 0.1 mm.

In one embodiment, each of the first and second conductive layers has an energy bandgap larger than an energy bandgap of the semiconductor substrate. In one embodiment, the first and second electrodes are in ohmic-contacts with the first and second conductive layers respectively. In one embodiment, each of the first and second electrode has surface continuity at a boundary portion between intersecting planes, thereby to prevent the charge concentration thereto at the edge of each electrode.

In one embodiment, the semiconductor substrate is made of GaAs. In one embodiment, each of the first and second conductive layers is made of one selected from a group consisting of GaAs, InGaP, and AlGaAsP. In one embodiment, each of the first and second conductive layers is made of GaAs, and first and second etch-stop layers are disposed between the first and second conductive layers and the substrate respectively, wherein each of the first and second etch-stop layers is made of one selected from a group consisting of AlAs and InP. In one embodiment, the device further comprises an un-doped buffer layer on the semiconductor substrate.

In one embodiment, both of the first and second conductive layers are disposed on a single face of the semiconductor substrate. In one embodiment, a first pair of the conductive layers is disposed on a first face of the semiconductor substrate, and a second pair of the conductive layers is disposed on a second face of the semiconductor substrate, wherein the first and second faces are opposing to each other. In one embodiment, a first pair of the conductive layers is disposed on a first face of the semiconductor substrate, and a second pair of the conductive layers is disposed on a second face of the semiconductor substrate, wherein the first and second faces are opposing to each other, wherein during an operation of the photoconductive semiconductor switch device, a voltage is applied to and between an electrode on one conductive layer of the first pair of the conductive layers and an electrode on one conductive layer of the second pair of the conductive layers. In one embodiment, the first pair includes a plurality of the first pairs and the second pair includes a plurality of the second pairs, wherein a first voltage-applied electrode corresponding to the first pair and a second voltage-applied electrode corresponding to the second pair are selected such that a distance therebetween is the largest.

In another aspect, there is provided a photoconductive semiconductor switch device configured to convert a pulse-shaped optical signal in an ultra-high frequency band including terahertz frequency into an electrical signal, the device comprising: a semiconductor substrate configured to generate electrons and holes using incident light thereto; at least one pair of doped conductive layers disposed on the semiconductor substrate, wherein one pair of the conductive layers consists of first and second conductive layers spaced apart from each other; and first and second electrodes disposed on at least partially on the first and second conductive layers respectively; wherein the first and second conductive layers include first and second inner and outer ledge portions respectively, wherein each of the first and second inner ledge portions further extends inwardly from each of positions of the first and second conductive layers vertically overlapping each of inner ends of the first and second electrodes, wherein each of the first and second outer ledge portions further extends outwardly from each of positions of the first and second conductive layers vertically overlapping each of outer ends of the first and second electrodes. Each of the first and second electrodes has a rectangular shape, and has a rounded edge.

In still another aspect, there is provided a method for manufacturing a photoconductive semiconductor switch device, the method comprising: providing a semi-insulating semiconductor substrate configured to generate electrons and holes using incident light thereto; providing a conductive layer disposed on the semiconductor substrate; providing first and second spaced electrodes disposed on the conductive layer; and etching the conductive layer using first and second masks with first and second areas larger than those of the first and second electrodes respectively such that the conductive layer is defined into first and second spaced conductive layers with first and second areas larger than those of the first and second electrodes respectively and thus with first and second ledge portions respectively.

In one embodiment, each of the first and second ledge portions further extends inwardly from each of positions of the first and second conductive layers vertically overlapping each of inner ends of the first and second electrodes. In one embodiment, the method further comprises, prior to providing the conductive layer, providing a buffer layer on the substrate and providing an etch-stop layer on the buffer layer. In one embodiment, etchants to etch the etch-stop layer and the conductive layers are different. Each of the first and second electrodes has a rounded edge. In one embodiment, the method further comprises providing a passivation layer after etching the conductive layer and partially removing the passivation layer to expose partially the first and second electrodes.

Advantageous Effects

In accordance with the present disclosure, the photoconductive semiconductor switch device capable of reliably operating in extreme environments defined by the high voltages and high outputs, and the method for manufacturing the above-defined switch device may be realized.

MODE FOR CARRYING OUT THE INVENTION

Hereinafter, specific embodiments of the present invention will be described in detail with reference to the drawings. However, the spirit and scope of the present invention is not limited to the embodiments described below. Upon reading the present disclosure, those skilled in the art may easily derive other embodiments included in the scope and spirit of the present invention by adding, changing, deleting, and substituting the elements disclosed herein.

Figure 1:
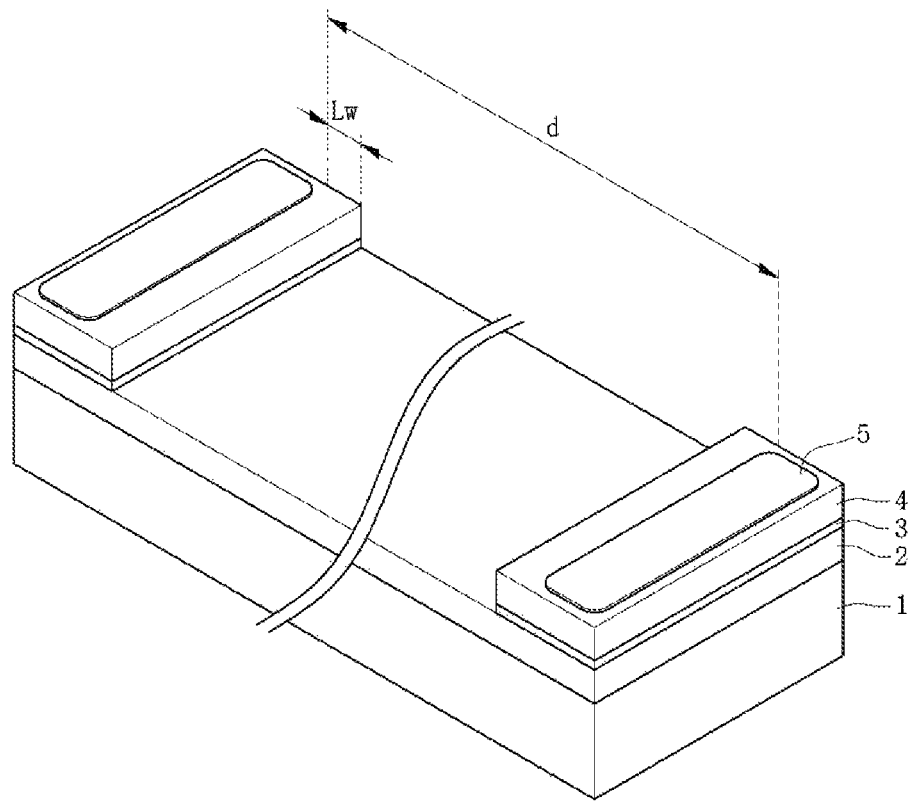
FIG. 1 is a perspective view of a photoconductive semiconductor switch device according to an embodiment.
Figure 2:
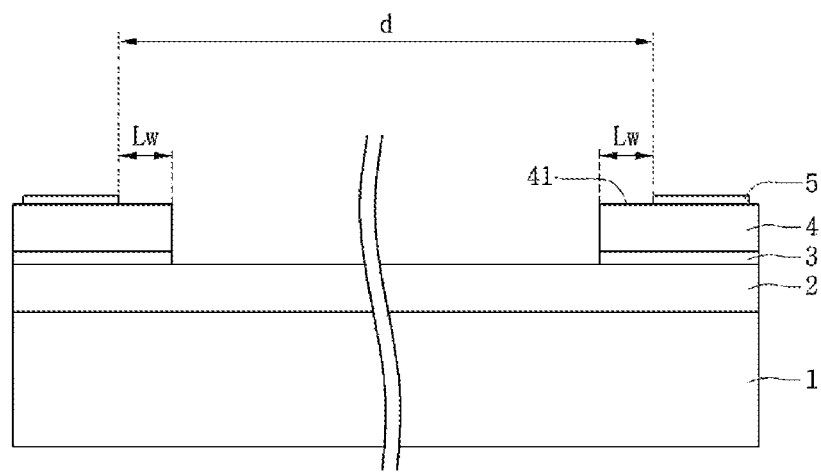
FIG. 2 is a cross-sectional view of a photoconductive semiconductor switch device according to an embodiment.

FIG. 1 is a perspective view of a photoconductive semiconductor switch device according to an embodiment. FIG. 2 is a cross-sectional view of a photoconductive semiconductor switch device according to an embodiment.

Referring to FIGS. 1 and 2, the photoconductive semiconductor switch device comprises a semiconductor substrate 1; a buffer layer 2 disposed on the semiconductor substrate 1; first and second etch-stop layers 3 disposed on the buffer layer 2, the first and second etch-stop layers 3 being spaced from each other; first and second conductive layers 4 disposed on the first and second etch-stop layers 3 respectively; first and second electrodes 5 disposed at least partially on the first and second conductive layers 4 respectively. Thus, even when there is no incident light to the switch device, each of the first and second conductive layers 4 may contain many electrons or holes therein. Thus, due to each of the first and second conductive layers 4, the high resistances in the semiconductor region around the edges and beneath the bottom of each of the first and second electrodes 5, as described above may be at least partially lowered. Thus, the resulting problem, that is, the deterioration of the switch device, as described above may be at least partially solved.

Each of the above components in the present switch device will be described in more detail.

The semiconductor substrate 1 may be preferably made of a semi-insulating substrate with very high quality but low conductivity. When the semiconductor substrate 1 is embodied as a GaAs substrate among compound semiconductor substrates, donors or acceptors may be implanted deeply thereto through Fe doping. Thus, the semi-insulating substrate may be completed by compensating donors or acceptors at unintentionally shallowly-doped levels.

The edge portions of each of the first and second electrodes 5 may be rounded. In other words, a chamfer may be performed at the edge portions to prevent the concentration of charges thereon. As a result, each electrode has surface continuity at a boundary portion between intersecting planes so as to prevent the electrons or holes from concentrating on the boundary portion. In FIG. 1, it may be seen that each electrode 4 is formed in a rectangular shape as a whole and the edge portions thereof are rounded or chamfered. In terms of a moving direction of the electrons and holes generated by the photon, that is, a movement path of the electrons or holes, it is more preferable that the edges of the first and second electrodes facing away each other are rounded.

Each of the first and second electrodes 5 are made of AuGe/Ni/Au, Pd/Ni/Au, and the like so as to provide an ohmic contact with the conductive layer.

Each of the first and second conductive layers 4 are doped with n-type or p-type dopants and thus have low electrical resistance which is much lower than that of the substrate 1. Otherwise, in the absence of the first and second conductive layers 4, the incident light does not reach the semiconductor substrate region directly under each electrode in which the semiconductor forms the direct ohmic contact with the electrode, and, thus, there is no electron-hole pair in the semiconductor substrate region directly under the electrode. Therefore, the resistance in the semiconductor substrate region directly under the electrode is larger than that in the semiconductor substrate region between the two electrodes. Therefore, a high resistance occurs in the semiconductor region beneath the bottom of each electrode and/or around the edge of each electrode. Due to the high resistance, a failure may occur in the above-defined semiconductor region, which acts as a limitation for the voltage and output of the PCSS. Each of the first and second conductive layers 4 may be made of GaAs or InGaP or AlGaAs doped n-type or p-type dopants. $N^+$ GaAs or $n^+$ InGaP may be employed for ease of fabrication.

In addition, the first and second conductive layers 4 may have first and second ledge portions 41 respectively. Each of the first and second ledge portions further extends inwardly from each of positions of the first and second conductive layers 4 vertically overlapping each of inner ends of the first and second electrodes 5. These first and second ledge portions 41 act to further lower high resistances at edges of the first and second electrodes 5 respectively, thus to allow the PCSS to cope with the high voltage and high power more actively. In addition, each of the first and second conductive layers 4 is made of a material having a higher bandgap than that of the substrate 1, whereby the light absorption of each of the first and second conductive layers 4 is greater than the light absorption of the substrate 1. Thus, the incident light is not absorbed in the first and second conductive layers 4, but reaches the substrate 1, so that the photon can play the role of providing electrons and holes in the semiconductor substrate. Further, this is because the carriers are abundant in the first and second ledge portions 41, and thus the resistance therein is low and, hence, the photon does not need to be used. When the thickness of each of the first and second conductive layers 4 is in the range of about 100 nm to 1 um, each conductive layer 4 can perform a function of providing the carriers. However, the present invention is not limited thereto.

A length Lw of each of the first and second ledge portions 41 is very short compared to the distance d between the two electrodes in the photoconductive semiconductor switch device. As an example, the distance d between the electrodes may be about 0.1 mm to 5 mm, and the length Lw of each of the first and second ledge portions 41 may be about 10 μm to 0.1 mm. In other words, the distance d may be about 10 to 500 times the length Lw of each ledge portion.

Due to the first and second conductive layers 4 having their respective first and second ledge portions 41, as described above, even though the incident light does not reach the semiconductor substrate regions directly below the first and second electrodes 5 made of the metal and/or around the edges thereof, the semiconductor substrate regions have the lower resistance. In other words, the local high resistance region in the semiconductor substrate may be removed. This can increase the breakdown voltage of the photoconductive semiconductor switch device in the semiconductor substrate regions. This configuration is applied to the photoconductive semiconductor switch device to which the high power and high voltage are applied, and thus the application of the PCSS is diversified.

Each of the first and second conductive layers 4 are doped with a p-type or n-type dopant, so that the ohmic contact thereof with the electrode made of the metal is easily realized. Therefore, this can also help improve the performance of the photoconductive semiconductor switch device.

The buffer layer 2 may be provided on the substrate 1. The buffer layer 2 may be provided for protection of the substrate 1 and for defect-free crystal growth. As the buffer layer 2, undoped GaAs may be used.

Between the buffer layer 2 and each of the first and second conductive layers 4, the etch-stop layer 3 may be provided. The etch-stop layer 3 allows a conductive layer to be selectively etched to define the first and second conductive layers 4 with the first and second ledge portions 41 respectively. More specifically, when the buffer layer 2, the etch-stop layer 3, and the conductive layer, and the first and second electrodes 5 are deposited on the substrate 1 in this order, the conductive layer 4 is etched to define the first and second conductive layers 4 with the first and second ledge portions 41 respectively. In this connection, the etch-stop layer 3 allows the conductive layer to be selectively etched to define the first and second conductive layers 4 with the first and second ledge portions 41. The etch-stop layer 3 may be applied when the material of each of the first and second conductive layers 4 is GaAs based and thus has an etch rate similar to those of the buffer layer and the substrate layer. In one example, when GaAs is used as the material of each of the first and second conductive layers 4, the etch-stop layer 3 may be made of AlAs, AlGaAs, InGaP or InP. Otherwise, when each of the first and second conductive layers 4 is made of InGaP or AlGaAs, the etch-stop layer 3 is not required because the etching rates therebetween are different.

The buffer layer 2 and the etch-stop layer 3 are not necessarily provided. However, it goes without saying that it is more preferable to provide the buffer layer 2 and the etch-stop layer 3 for convenience of processing, improvement of performance, and increase of yield, etc.

On the other hand, in the above-described embodiment, the incident light is irradiated from above, that is, from above the electrode, with reference to the drawings. However, it is more preferable for the incident light to be irradiated from below the semiconductor substrate 1 with reference to the drawings. This is because the electrode reflects the incident light when the incident light is irradiated from above, that is, from above the electrode. This reflection do not contribute to the formation of electrons and holes in the semiconductor substrate 1 located below the first and second electrodes 5. In other words, when the incident light is irradiated from above the electrode, the incident light is reflected by the first and second electrodes 5 made of the metal, and, thus, the incident light may not reach the semiconductor substrate 1. This leads to light loss. Therefore, it is preferable that the incident light is irradiated from below the semiconductor substrate so that the incident light is not reflected from the first and second electrodes 5. Even though the light is reflected from the electrodes, it is desirable that it is incident again on the semiconductor substrate 1, so that the incident light can be sufficiently utilized. This not only improves the efficiency of the incident light, but also lowers the resistance in the semiconductor substrate beneath the bottom of each of the first and second electrodes 5 to achieve a high output voltage of the PCSS.

Further, It is preferable that the incident light is incident not only onto the region of the semiconductor substrate 1 located between the first and second electrodes 5 but also on the regions of the semiconductor substrate 1 overlapping the first and second electrodes 5 and the first and second ledge portions 41. In this case, when the incident light is a laser, the current pulse and voltage pulse generated from the photoconductive semiconductor switch device may be the narrowest and the strongest. This not only improves the efficiency of the incident light, but also lowers the resistance in the semiconductor substrate beneath the bottom of each of the first and second electrodes 5 to achieve a high output voltage of the PCSS.

Figure 3:
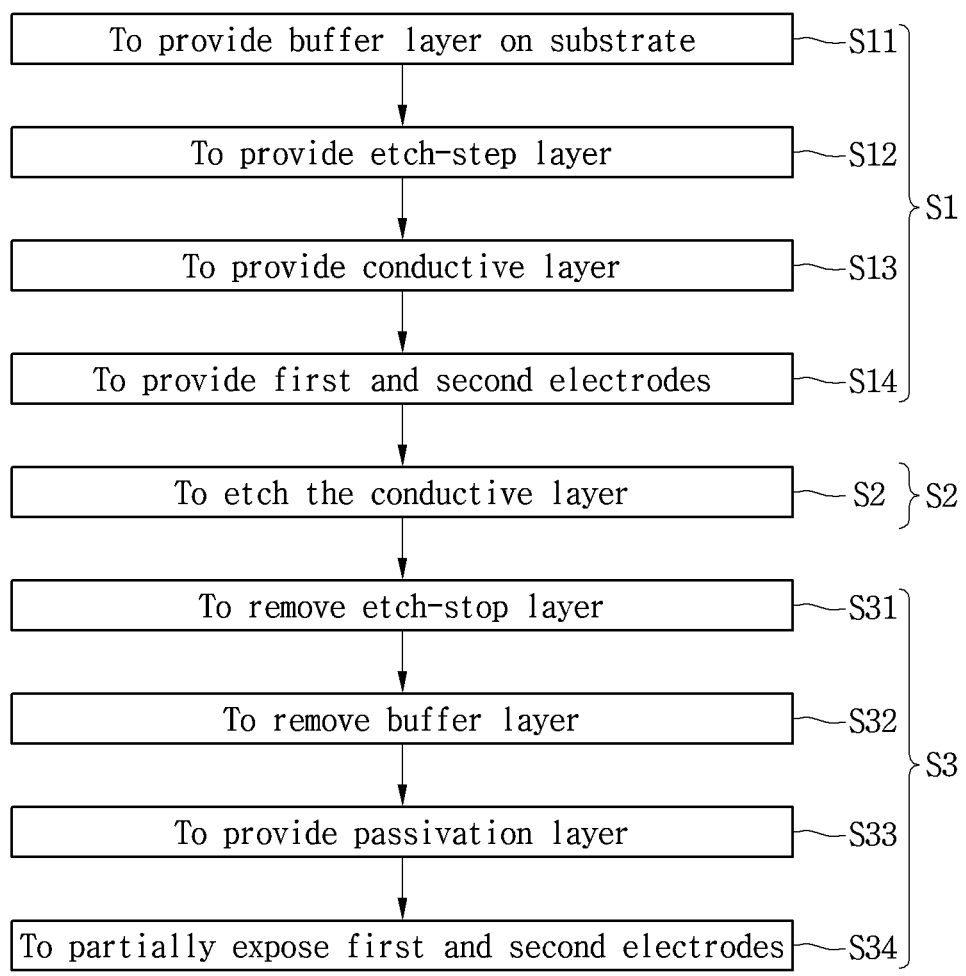
FIG. 3 is a flow chart of a method for manufacturing a photoconductive semiconductor switch device according to an embodiment.

FIG. 3 is a flowchart illustrating a method for manufacturing the photoconductive semiconductor switch device according to an embodiment.

Referring to FIG. 3, the method for manufacturing the photoconductive semiconductor switch device mainly includes a first process S1 for forming each of the layers constituting the switch device, a second process S2 for dividing the first and second ledge portions 41, and a third step S3 for post-treating the switch element.

First, the above-mentioned first process S1 proceeds as follows. The semi-insulating GaAs substrate 1 is provided and then un-doped GaAs is grown as the buffer layer 2 on the substrate S11. The buffer layer may act to facilitate the growth of the first and second conductive layers 4 thereon and to protect the surface of the substrate 1. Next, the etch-stop layer 3 may be grown on the buffer layer 2 S12. The etch-stop layer 3 may be provided to define the first and second ledge portions 41 in the second process S2 in the case where the first and second conductive layers 4 have etch rates similar to the buffer layer 2 and the substrate 1. For example, when each of the first and second conductive layers 4 is made of n-type GaAs, each of the etch-stop layer 3 may be made of AlAs, AlGaAs, InGaP, or InPd.

In this connection, as described above, it may dispense with the buffer layer 2 and the etch-stop layer 3.

Next, the first and second conductive layers 4 doped with n-type or p-type dopants are grown to a thickness of 100 nm to 1 μm on the buffer layer 2 or on the etch-stop layer 3 if present respectively S13. For this growth, MBE or MOCVD may be used. Each of the first and second conductive layers 4 may be made of one selected from InGaP, AlGaAs, and GaAs. The thickness of each of the first and second conductive layers 4 may be 5 to 10 times the thickness of the buffer layer 2.

Subsequently, a metal stack realizing the ohmic contact is provided as the first and second electrodes 5 on the first and second conductive layers respectively S14. When the metal stack contacts the n-type semiconductor, the metal stack may include AuGe/Ni/Au, or Pd/Ni/Au, etc. When the metal stack contacts the p-type semiconductor, the metal stack may include Au/Zn/Au, Pd/Mn/Sb/Au, or Ni/Mg/Au, etc. The first and second electrodes 5 may be formed by vapor deposition or sputtering, etc. Further, when defining the first and second electrodes 5 by the lift off or etching technique, the edges thereof are rounded, as seen in FIG. 1. According to such a configuration, the problem that charge is concentrated on the edge may be alleviated.

The second process S2 is performed as follows. The first and second ledge portions 41 with larger sizes than those of the first and second electrodes 5 respectively are subjected to lithography. The first and second ledge portions 41 are then used as an etch mask to etch away the first and second conductive layers 4 made of GaAs, InGaP or AlGaAs, located between the first and second ledge portions 41.

In this connection, when the first and second conductive layers 4 are made of InGaP or AlGaAs whose etch rate is greater than that of GaAs constituting the buffer layer 2 and the substrate 1, no separate etch-stop layer 3 is required at the time of etching. However, when the first and second conductive layers 4 are made of $Al_xGa_{1-x}As$ (x<0.3) with a low aluminum content or GaAs, the selective etching therebetween is not enabled. Therefore, the etching is performed using the etch-stop layer 3 made of AlAs, InGaP, $Al_xGa_{1-x}As$ (x>0.6) with a high aluminum content, or InP. Thereby, using the wet or dry etching method, the first and second ledge portions 41 may be defined.

The third process S3 is performed as follows. First, the etch-stop layer 3 between the first and second ledge portions 41 is removed using an etch solution or etch chemistry S31. Subsequently, the buffer layer 2 is partially or totally etched away S32. When the buffer layer 2 has a very low doping level (e.g., $10^{15}/cm^3$), the buffer layer 2 may not be removed.

Thereafter, a passivation layer is formed S33. As the passivation layer, a dielectric layer such as SiNx, SiO2 or the like may be deposited. The passivation layer may be deposited to a thickness of about a quarter of the laser wavelength for optical excitation. In this case, the passivation layer may function not only as a protective layer but also as an anti-reflection layer.

After the operation S33, the passivation layer is removed partially exposed on the first and second electrodes 5. Thereafter, the first and second electrodes 5 are electrically connected to the outside of the switch device through the exposed openings S34.

The manufacturing method of the PCSS of the present invention may further include another embodiment. For example, in another embodiment, the step of providing the buffer layer may be eliminated. Further, in another embodiment, the step of providing the etch-stop layer may be eliminated.

Figure 4:
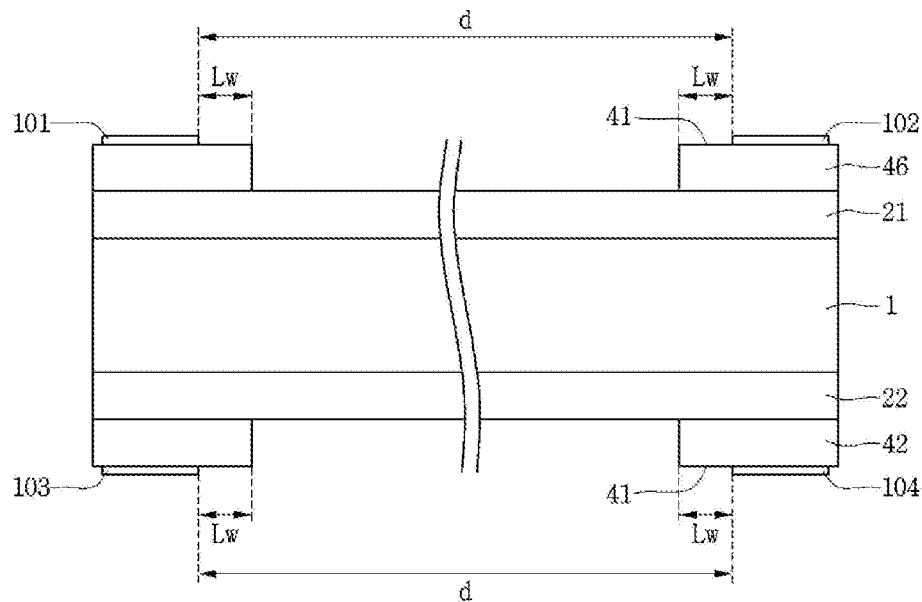
FIG. 4 is a perspective view of a photoconductive semiconductor switch device according to another embodiment.
Figure 5:
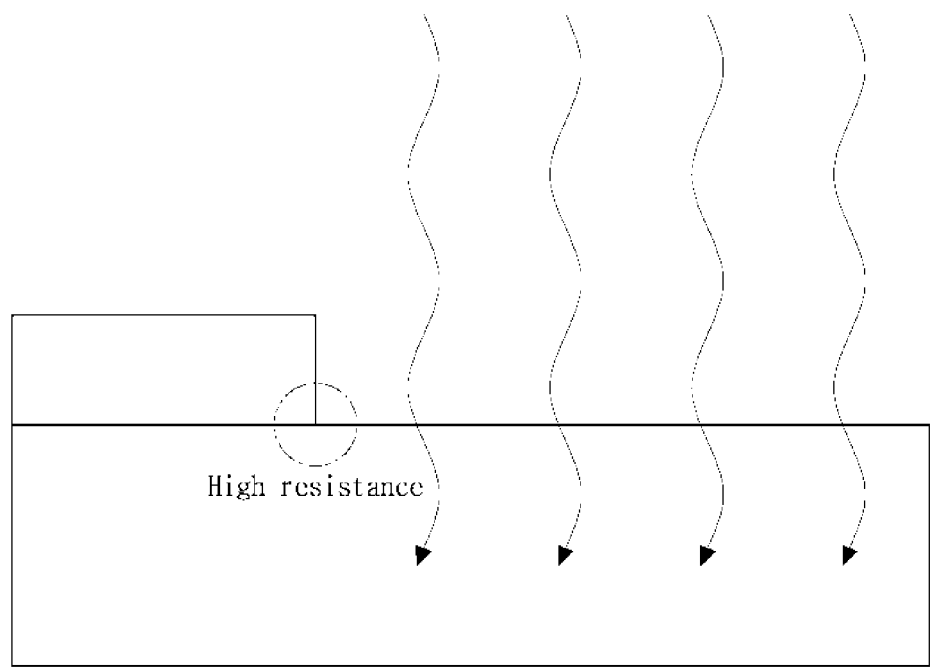
FIG. 5 is a cross-sectional view of a photoconductive semiconductor switch device according to a prior art, wherein one electrode region is enlarged.

FIG. 4 is a cross-sectional view of a photoconductive semiconductor switch device according to another embodiment. The embodiment shown in FIG. 4 is based on the embodiment shown in FIGS. 1 to 3. In this embodiment, at least one first pair of the conductive layers and electrodes is disposed on a first face of the semiconductor substrate 1 and at least one second pair of conductive layers and electrodes is disposed on a second face of the semiconductor substrate 1, wherein the first face is opposite to the second face. Therefore, the descriptions of the components, the operation, and the manufacturing method for the photoconductive semiconductor switch device according to this embodiment may be the same as those for the embodiment shown in FIGS. 1 to 3.

Referring to FIG. 4, in the photoconductive semiconductor switch device according to this embodiment, first and second buffer layers 21 and 22 are provided on the front and rear surfaces of the semiconductor substrate 1, respectively. On these first and second buffer layers 21 and 22, first and second pairs of conductive layers 46 and 42 are disposed respectively. The electrodes are disposed on the conductive layers 46 and 42 respectively. Specifically, a first electrode 101 and a second electrode 102 are disposed on the first pair of the spaced conductive layers 46 respectively. A third electrode 103 and a fourth electrode 104 are disposed on the second pair of the spaced conductive layers 42, respectively.

In this embodiment, there is no etch-stop layer 3. However, the present disclosure is not limited thereto. The etch-stop layer 3 may be added if necessary. The semiconductor substrate 1 and the first and second buffer layers 21 and 22 and the first and second pairs of the conductive layers 42 and 46 are identical in construction and material to those in the previously defined embodiment. In particular, the first and second pairs of the conductive layers 42 and 46 may be doped n-type or p-type dopants.

During an operation of the photoconductive semiconductor switch device in accordance with this embodiment, a voltage is applied to and between an electrode on one conductive layer of the first pair of the conductive layers 46 and an electrode on one conductive layer of the second pair of the conductive layers 42. In one example, the voltage is applied to and between the first electrode 101 and the fourth electrode 104 or to and between the second electrode 102 and the third electrode 103. Further, a first voltage-applied electrode corresponding to the first pair 46 and a second voltage-applied electrode corresponding to the second pair 41 are selected such that a distance therebetween is the largest. When the voltage is applied to and between one electrode on one conductive layer of the first pair of the conductive layers 46 on the front face of the substrate and one electrode on one conductive layer of the second pair of the conductive layers 42 on the rear face of the substrate, the electric field generated between the two electrode, especially, the electric field generated at the edge of each electrode may be reduced. Therefore, degradation of the photoconductive semiconductor switch device can be further reduced. Of course, when one of the electrodes is deteriorated, the combination of electrodes to which the voltage is applied may be changed. Further, the semiconductor substrate is turned upside down to allow a non-deteriorated electrode to be used for the operation of the PCSS.

INDUSTRIAL APPLICABILITY

The photoconductive semiconductor switch device according to the present invention can operate at the high voltage and high output. Thus, the application of the photoconductive semiconductor switch device may be various. The photoconductive semiconductor switch device operates reliably.

What is claimed is:

1. A photoconductive semiconductor switch device comprising:
   a semiconductor substrate configured to generate electrons and holes using incident light thereto;
   at least one pair of conductive layers disposed on the semiconductor substrate, wherein one pair of the conductive layers consists of first and second conductive layers spaced apart from each other, wherein each of the first and second conductive layers contains a plurality of electrical carriers; and
   first and second electrodes disposed at least partially on the first and second conductive layers respectively,
   wherein each of the first and second electrodes has surface continuity at a boundary portion between intersecting planes, and wherein each of the first and second conductive layers has an energy bandgap larger than an energy bandgap of the semiconductor substrate.

2. The device of claim 1, wherein the first and/or second conductive layers include first and/or second ledge portions respectively, wherein each of the first and/or second ledge portions respectively further extends inwardly from each of positions of the first and/or second conductive layers respectively vertically overlapping each of inner ends of the first and/or second electrodes, wherein the first and/or second ledge portions respectively act to lower electrical resistances in regions of the semiconductor substrate vertically overlapping the first and/or second ledge portions.

3. The device of claim 2, wherein the first and second conductive layers include the first and second ledge portions respectively.

4. The device of claim 2, wherein a spacing between the first and second electrodes is about 10 to 500 times larger than a length of each of the first and/or second ledge portions.

5. The device of claim 2, wherein a spacing between the first and second electrodes is in a range of about 0.1 mm to 5 mm, and a length of each of the first and/or second ledge portions is in a range of about 10 μm to 0.1 mm.

6. The device of claim 2, wherein a first pair of the conductive layers is disposed on a first face of the semiconductor substrate, and a second pair of the conductive layers is disposed on a second face of the semiconductor substrate, wherein the first and second faces are opposing to each other.

7. The device of claim 1, wherein the first and second electrodes are in ohmic contact with the first and second conductive layers respectively.

8. The device of claim 1, wherein the semiconductor substrate is made of GaAs.

9. The device of claim 8, wherein each of the first and second conductive layers is made of one selected from a group consisting of GaAs, InGaP, and AlGaAsP.

10. The device of claim 9, wherein each of the first and second conductive layers is made of GaAs, and first and second etch-stop layers are disposed between the first and second conductive layers and the substrate respectively, wherein each of the first and second etch-stop layers is made of one selected from a group consisting of AlAs and InP.

11. The device of claim 1, further comprising an un-doped buffer layer on the semiconductor substrate.

12. The device of claim 1, wherein both of the first and second conductive layers are disposed on a single face of the semiconductor substrate.

13. The device of claim 1, wherein a first pair of the conductive layers is disposed on a first face of the semiconductor substrate, and a second pair of the conductive layers is disposed on a second face of the semiconductor substrate, wherein the first and second faces are opposing to each other, wherein during an operation of the photoconductive semiconductor switch device, a voltage is applied to and between an electrode on one conductive layer of the first pair of the conductive layers and an electrode on one conductive layer of the second pair of the conductive layers.

14. The device of claim 13, wherein the first pair includes a plurality of the first pairs and the second pair includes a plurality of the second pairs, wherein a first voltage-applied electrode corresponding to the first pair and a second voltage-applied electrode corresponding to the second pair are selected such that a distance therebetween is the largest.

15. A method for manufacturing a photoconductive semiconductor switch device, the method comprising:
providing a semi-insulating semiconductor substrate configured to generate electrons and holes using incident light thereto;
providing a conductive layer disposed on the semiconductor substrate;
providing first and second spaced electrodes disposed on the conductive layer; and
etching the conductive layer using first and second masks with first and second areas larger than those of the first and second electrodes respectively, such that the conductive layer is defined into first and second spaced conductive layers with the first and second areas larger than those of the first and second electrodes respectively, and such that the first and second spaced conductive layer comprise first and second ledge portions respectively,
wherein each of the first and second electrodes has a rectangular shape, and has a rounded edge, and
wherein each of the first and second conductive layers has an energy bandgap larger than an energy bandgap of the semiconductor substrate.

16. The method of claim 15, wherein each of the first and second ledge portions further extends inwardly from each of positions of the first and second conductive layers vertically overlapping each of inner ends of the first and second electrodes.

17. The method of claim 16, further comprising, prior to providing the conductive layer, providing a buffer layer on the substrate and providing an etch-stop layer on the buffer layer.

18. The method of claim 17, wherein etchants to etch the etch-stop layer and the conductive layers are different.

* * * * *